(12) United States Patent
Divakaruni et al.

(10) Patent No.: US 6,501,131 B1
(45) Date of Patent: Dec. 31, 2002

(54) TRANSISTORS HAVING INDEPENDENTLY ADJUSTABLE PARAMETERS

(75) Inventors: Rama Divakaruni, Middletown, NY (US); Jeffrey P. Gambino, Westford, VT (US); Jack A. Mandelman, Stormville, NY (US); Rajesh Rengarajan, Poughkeepsie, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 09/359,291

(22) Filed: Jul. 22, 1999

(51) Int. Cl.$^7$ .................. H01L 29/76; H01L 29/94; H01L 31/062

(52) U.S. Cl. .............. 257/344; 257/345; 257/773; 438/289; 438/291

(58) Field of Search ............... 438/291, 289; 257/344, 345, 773

(56) References Cited

U.S. PATENT DOCUMENTS

| | | | |
|---|---|---|---|
| 4,745,079 A | * | 5/1988 | Pfiester |
| 5,244,823 A | * | 9/1993 | Adan |
| 5,270,234 A | * | 12/1993 | Huang et al. |
| 5,413,949 A | * | 5/1995 | Hong |
| 5,548,143 A | * | 8/1996 | Lee ............................ 257/269 |
| 5,571,738 A | * | 11/1996 | Krivokapic |
| 5,605,855 A | * | 2/1997 | Chang et al. |
| 5,614,430 A | * | 3/1997 | Liang et al. |
| 5,776,821 A | * | 7/1998 | Haskell et al. .............. 438/585 |
| 5,804,496 A | * | 9/1998 | Duane ......................... 438/520 |
| 5,856,225 A | * | 1/1999 | Lee et al. .................... 438/291 |
| 5,879,998 A | * | 3/1999 | Krivokapic ................. 438/300 |
| 5,888,867 A | * | 3/1999 | Wang et al. ................ 438/257 |
| 5,915,181 A | * | 6/1999 | Tseng .......................... 438/289 |
| 5,956,588 A | * | 9/1999 | Choi et al. .................. 438/286 |
| 6,017,799 A | * | 1/2000 | Chien et al. ................ 438/291 |
| 6,184,566 B1 | * | 2/2001 | Gardner et al. ............. 257/510 |

* cited by examiner

*Primary Examiner*—Richard Booth
(74) *Attorney, Agent, or Firm*—Ratner & Prestia; Todd M. C. Li

(57) ABSTRACT

The process rules for manufacturing semiconductor devices such as MOSFET's are modified to provide dual work-function doping following the customary gate sidewall oxidation step, greatly reducing thermal budget and boron penetration concerns. The concern of thermal budget is further significantly reduced by a device structure which allows a reduced gap aspect ratio while maintaining low sheet resistance values. A reduced gap aspect ratio also relaxes the need for highly reflowable dielectric materials and also facilitates the use of angled source-drain (S-D) and halo implants. Also provided is a novel structure and process for producing a MOSFET channel, lateral doping profile which suppresses short channel effects while providing low S-D junction capacitance and leakage, as well as immunity to hot-carrier effects. This also affords the potential for reduction in the contact stud-to-gate conductor capacitance, because borderless contacts can be formed with an oxide gate sidewall spacer. As a result, the S-D junctions can be doped independently of the gate conductor doping, more easily allowing a variety of MOSFET structures.

15 Claims, 11 Drawing Sheets

TRANSISTORS HAVING INDEPENDENTLY ADJUSTABLE PARAMETERS

TECHNICAL FIELD

The present invention is generally directed to the manufacture of semiconductors and, more particularly, to the manufacture of MOSFET (metal oxide semiconductor field effect transistor) devices.

BACKGROUND OF THE INVENTION

It has been found that, in practice, the ability to scale known MOSFET structures and processes is complicated by numerous concerns and competing factors. Frequently, the need to develop a structural or process enhancement to solve a particular problem leads to the creation of other problems which previously had not been an issue. For example, halo implant doping is often used to provide a region of enhanced channel doping at the perimeter of the source-drain (S-D) diffusions (e.g., boron halos are often used around the N+S-D diffusions of NMOSFETs). In practice, however, the need for high channel doping (including high halo implant doping) to suppress short channel roll-off can lead to increased junction leakage, high junction capacitance, and hot-carrier degradation. As another example, the increasing need for dual work-function gate conductors can lead to additional process integration complexity (in order to avoid boron penetration through the gate insulator).

Still other issues are caused by the higher aspect ratios of the spaces between adjacent gate conductors which have more recently become increasingly desirable. The need for higher aspect ratios is driven by the higher gate conductor stacks, which are required to achieve a low sheet resistance, as well as constantly shrinking device dimensions. A high aspect ratio tends, however, to limit the ability to use angled S-D and halo implants, and also tends to complicate dielectric gap fill processes. To fill such high aspect ratio gaps, a reflow of dielectrics (such as borophospho-silicate glass or BPSG) is required. But such reflow tends to add to an already critical thermal budget, which in turn makes it necessary to contain the thermal budget to realize a scaling of doping profiles and also to avoid boron penetration through the gate insulator.

Still further complications are caused by difficulties in containing gate conductor sheet resistance because of the reduced cross-sectional area which is encountered. To reduce this gate conductor wiring resistance, higher level "stitched" wiring is used (e.g., stitched wordlines). Stitched wiring tends to increase design complexity.

Therefore, the primary object of the present invention is to provide an improved structure and process for producing semiconductor devices, such as MOSFET's, for purposes of reducing thermal budget and boron penetration concerns. Another object of the present invention is to reduce the aspect ratios which can be achieved, while maintaining a low sheet resistance. Still another object of the present invention is to provide an improved MOSFET channel structure which can implement such improvements. A still further object of the invention is to provide a MOSFET with improved electrical characteristics, including reduced short channel effect, lower junction capacitance, reduced junction leakage, and improved hot-carrier reliability.

SUMMARY OF THE INVENTION

These and other objects which will become apparent are achieved in accordance with the present invention by modifying the process for manufacturing semiconductor devices such as MOSFET's to provide dual work-function doping following the customary gate sidewall oxidation step of the manufacturing process, greatly reducing thermal budget and boron penetration concerns. The concern of thermal budget (i.e., contributed to by BPSG dielectric reflow) is farther significantly reduced by a novel device structure which allows a reduced gap aspect ratio while maintaining low sheet resistance values. This reduced gap aspect ratio also relaxes the need for highly reflowable dielectric materials and also facilitates the use of angled S-D and halo implants, if desired.

Further provided is a novel structure and process for producing a MOSFET channel, lateral doping profile which suppresses short channel effects while providing low S-D junction capacitance and leakage, as well as immunity to hot-carrier effects. Yet another feature of the present invention is the potential for reduction in the contact stud-to-gate conductor capacitance, because the process of the present invention will allow a borderless contact to be formed with an oxide gate cap and oxide sidewall spacers.

An important feature of the process and the structures of the present invention is that the S-D junctions can be doped independently of the gate conductor doping which is performed. Such a process more easily allows the embodiment of N+gated p-type field effect transistors (PFET's) and P+gated n-type field effect transistors (NFET's), in addition to the standard N+gated NFET's and P+gated PFET's. Thus, the process and structures of the present invention achieve a variety of MOSFET structures. This flexibility is of significant value to product designers.

BRIEF DESCRIPTION OF THE DRAWING

The invention is best understood from the following detailed description when read in connection with the accompanying drawing. It is emphasized that, according to common practice, the various features of the drawing are not drawn to scale. On the contrary, the dimensions of the various features are arbitrarily expanded or reduced for clarity. Included in the drawing are the following figures.

DESCRIPTION OF PREFERRED EMBODIMENTS

In the description which follows, three illustrative embodiments for implementing the improvements of the present invention will be described, each of which result in distinctly different lateral channel profiles and process flows. Such differences result, in turn, in distinctly different device behavior. It is to be understood that still other variations will occur to the skilled artisan and that, as a result, the disclosed illustrations should not be interpreted as limiting in scope. A first embodiment is described with reference to the sequence of schematic illustrations shown in FIGS. 1 to 9.

Figure 1:
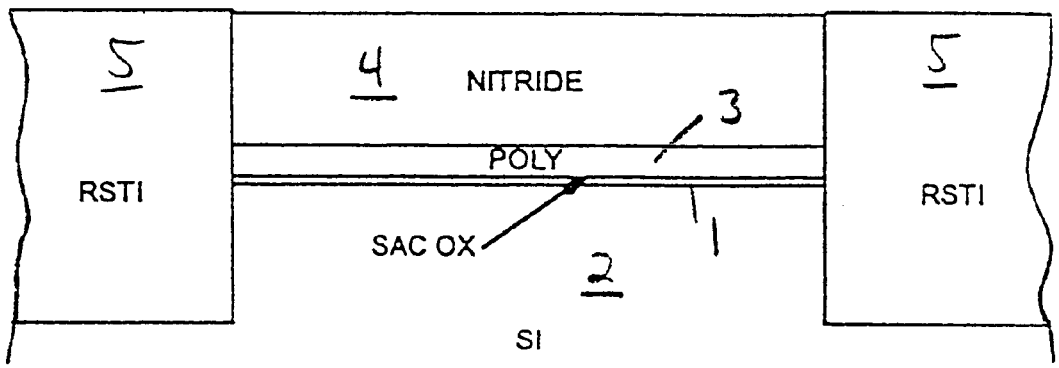
FIGS. 1 to 9 are sequential schematic illustrations showing a first embodiment of the improved process and structures of the present invention for manufacturing a MOSFET structure.

Referring to FIG. 1, a sacrificial oxide layer 1 is grown on a base wafer 2 (e.g., a silicon wafer), followed by the deposition of a layer 3 of polysilicon or an equivalent material and a layer 4 of silicon nitride ($Si_3N_4$) or an equivalent material. The doping of the polysilicon layer 3 is not critical because this layer will later be used as an etch stop for the nitride etch. The thickness of the nitride layer 4 will determine the thickness of a low resistivity metal gate conductor layer (e.g., tungsten) which is subsequently to be formed. Raised shallow trench isolation (RSTI) regions 5 are then patterned and formed using processes which are themselves known in the industry. Before filling the RSTI regions 5, isolation implants are preferably performed, again using processes which are themselves known in the industry.

Figure 2:
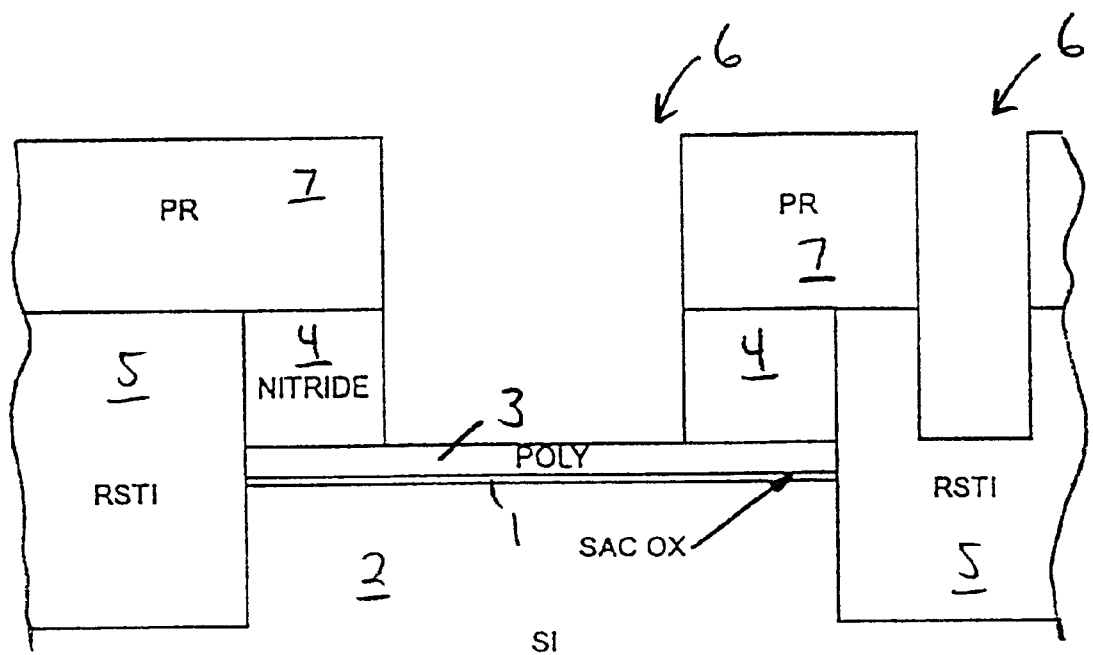

Referring to FIG. 2, the process continues by subjecting the nitride layer 4 and the RSTI region 5 to a directional anisotropic etching process selective to polysilicon, such as a reactive ion etching (RIE) process, through openings suitably patterned in a photoresist (PR) layer 7. As a result, apertures or openings 6 are concurrently formed in the (pad) nitride layer 4 and the adjacent RSTI region 5. These openings 6 will later define both the MOSFET gate regions and the low-resistance wiring channels over isolation.

Figure 3:
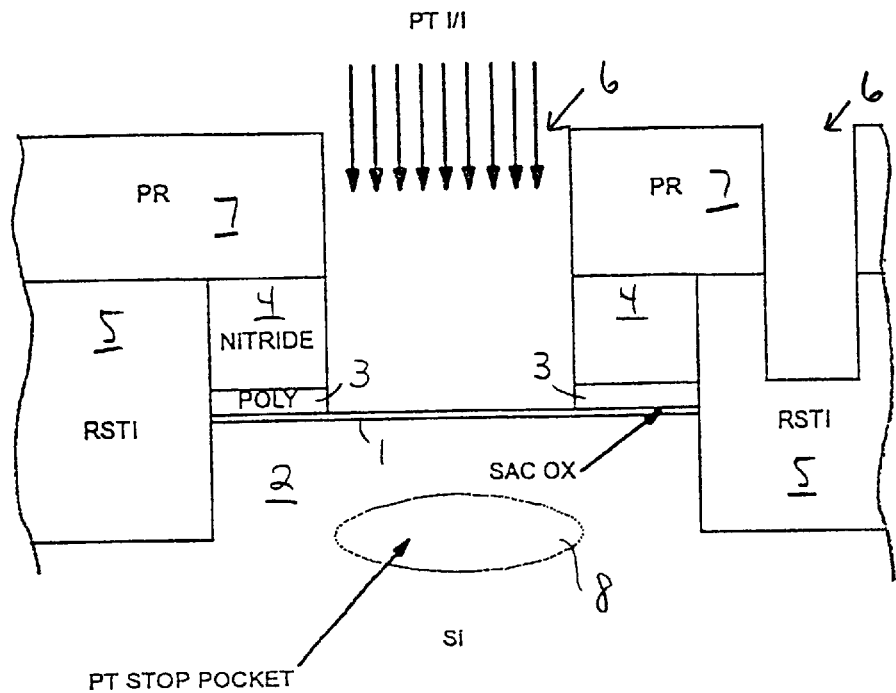

Referring to FIG. 3, the exposed polysilicon layer 3 is then subjected to a reactive ion etching process selective to nitride and oxide, stopping on the underlying sacrificial oxide layer 1. Punch-through ion implantation (PT I/I) is illustrated by the arrows of FIG. 3. A relatively deep sub-surface, punch-through suppression implant 8 (a "stop pocket") is then formed to prevent punch through between the source and the drain of the MOSFET which is later to be formed.

Figure 4:
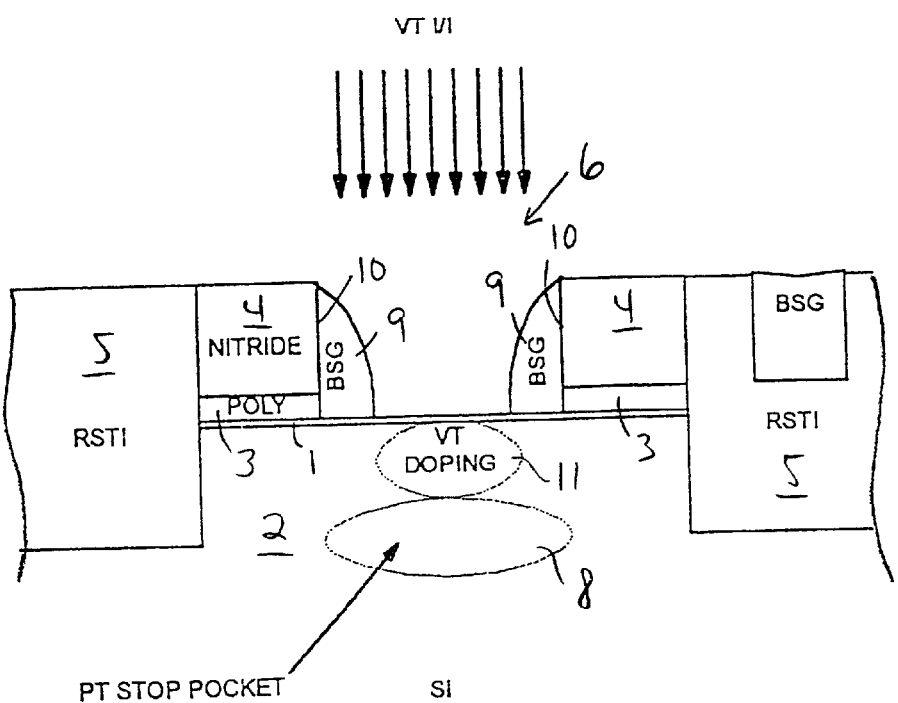

Referring to FIG. 4, the photoresist layer 7 is then stripped and spacers 9 are formed on the sidewalls 10 of the openings 6. The spacers 9 are preferably formed of a material that contains a P-type dopant, for example, a glass such as BSG (borosilicate glass). The channel is then ion implanted (I/I) at low energy to set the threshold voltage ($V_t$) of the MOSFET, see the arrows of FIG. 4, defining the channel doping profile or $V_t$ implant 11. The edges of the $V_t$ implant 11 are offset from the sidewalls 10 of the polysilicon/nitride stack. As will be apparent from the description which follows, this type of profile results in low doping concentration adjacent to the S-D diffusion layers. This configuration in turn provides for low junction capacitance, low junction leakage, and immunity from hot-carrier effects, while minimizing short-channel problems.

Figure 5:
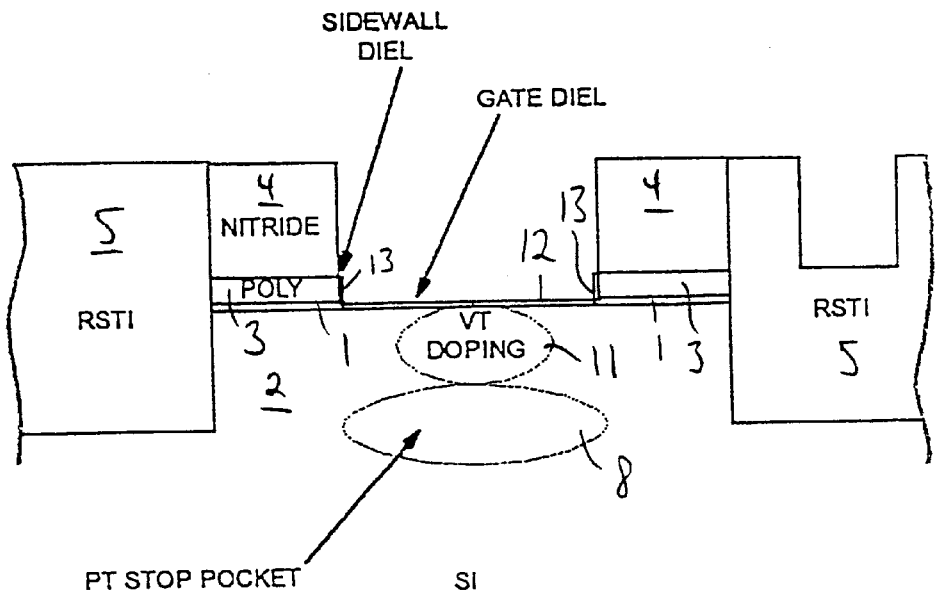

Referring to FIG. 5, the BSG spacers 9 are then stripped, selective to nitride layers 4 and to the fill of RSTI regions 5. The exposed sacrificial oxide layer 1 is thereafter stripped and a gate dielectric layer 12 is formed in its place. The gate dielectric layer 12 may be comprised of a thermally grown $SiO_2$, a nitride gate oxide, or a deposited dielectric film. The gate dielectric layer 12 is also formed on the sidewalls 13 of the exposed polysilicon layer 3.

Figure 6:
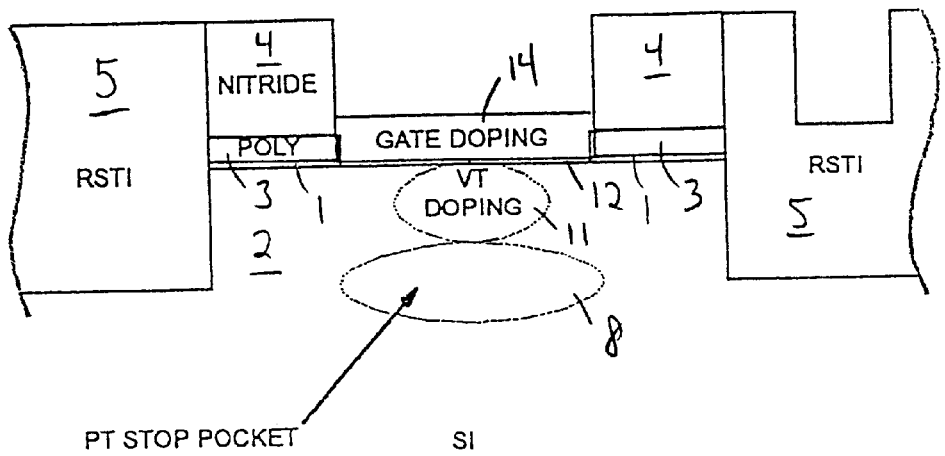

Referring to FIG. 6, a layer of polysilicon (or an equivalent material) is deposited to a thickness which completely fills the opening 6, to form a gate structure 14. The polysilicon layer is first planarized to the top surface of the pad nitride layers 4 and is then recessed selective to oxide and nitride, as shown. This polysilicon recessing operation substantially clears the wiring channel in the RSTI regions 5 of polysilicon. The exposed polysilicon of the gate structure 14 is then ion implanted, see the arrows of FIG. 6, to set the work-function of the gate conductor. This implant is preferably masked and performed twice to provided dual work-function gate doping.

Figure 7:
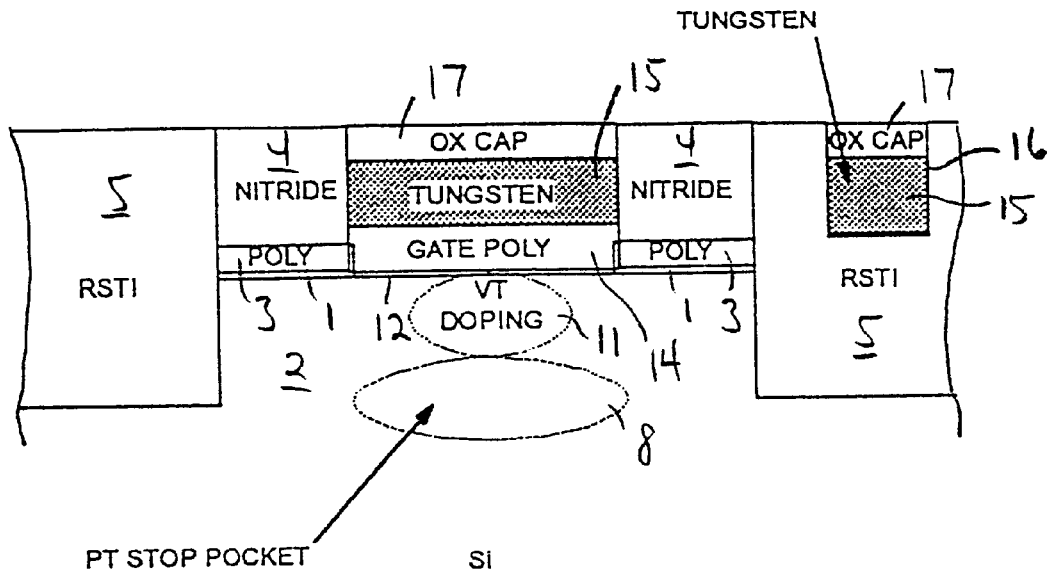

Referring to FIG. 7, tungsten (or possibly another refractory metal such as tantalum or molybdenum, or the silicides of these refractory metals) is deposited over the gate structure 14, filling the cavity defined above the gate, and within the wiring channel 16 formed in the RSTI region 5. The tungsten layer 15 is planarized and recessed selective to oxide and nitride. A CVD (chemical vapor deposition) oxide layer 17 is then deposited and planarized to form an insulating cap over the tungsten layer 15. The tungsten forms a low-resistance gate and wiring layer. The oxide cap will later be used to form diffusion contacts which are borderless to the gate conductor.

Figure 8:
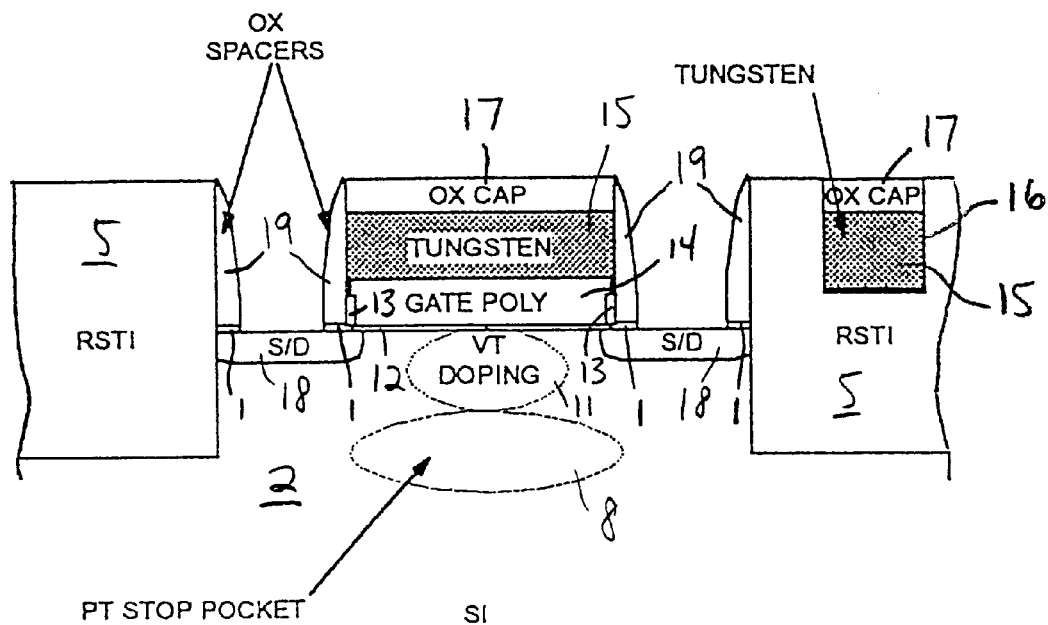

Referring to FIG. 8, the pad nitride layer 4 is removed by etching with hot phosphoric acid (or an equivalent wet or dry etch which etches silicon nitride with a high selectivity to Si or $SiO_2$) and the exposed polysilicon layer 3 is subjected to an anisotropic etch (e.g., a reactive ion etch) selective to oxide. S-D extension implants 18 may be made at this point in the process, and supplemental halo implants may be added, if desired. Oxide spacers 19 are then formed on the sidewalls of the S-D contact openings and higher-concentration contact implants are made.

It is important to note that the doping type for the S-D diffusion implantation is set independently of the doping type for the gate conductor. This flexibility allows a wide variety of MOSFET structures to be formed including P+gated NFET's, N+gated PFET's, N+gated NFET's, and P+gated PFET's. This feature gives the product designer added flexibility in selecting the threshold voltage ($V_t$) for the device being manufactured. Previously, significantly more complicated processes were required to provide such selection of the threshold voltage ($V_t$), because additional channel implants had to be made.

The foregoing process may also be used to form P+gated array NMOSFET's. P+gated array NMOSFET devices allow a reduction in channel doping concentration (which improves data retention time), a reduced gate oxide field during wordline boost, and elimination of the need for "negative wordline low" because the negative gate potential is now achieved with a built-in work-function difference between the gate and the source. This "built-in negative wordline low" feature greatly simplifies the design of wordline drivers. The reduced doping distribution indicated in FIG. 8 provides a reduced electric field at the S-D junctions, which results in reduced junction capacitance, reduced leakage, and improved hot-carrier reliability.

The structure is now ready for the formation of borderless contacts. Borderless diffusion contacts to the gate conductors are used extensively in dynamic random access memory (DRAM) arrays, where density is of great importance. The foregoing process also allows borderless contacts to be used in MOSFET applications other than DRAM array transistors.

Figure 9:
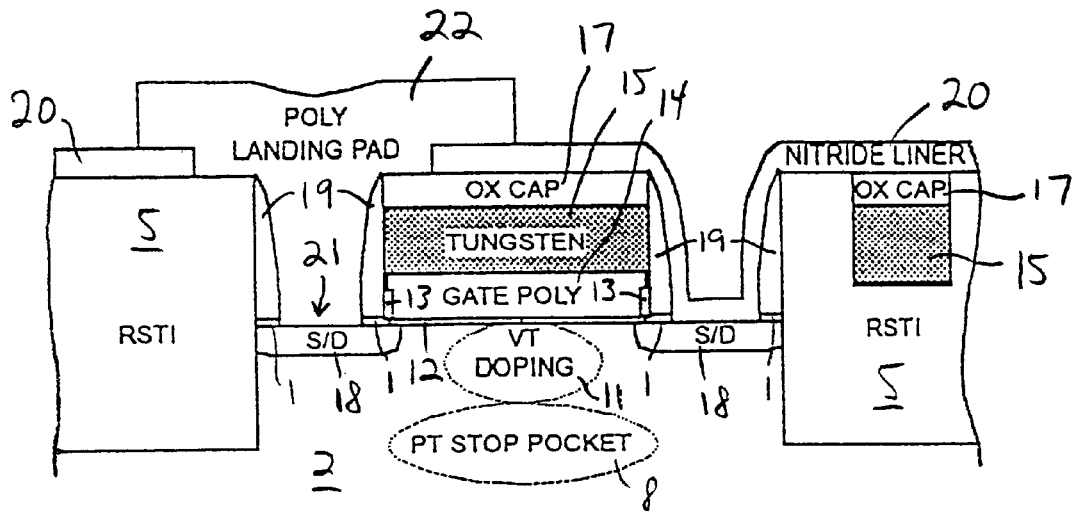

Referring to FIG. 9, a thin nitride layer 20 is first deposited over the structure shown in FIG. 8 so that the resulting deposit conforms to the underlying features. The nitride layer 20 provides an etch barrier over diffusions which are not desired to be contacted (e.g., storage node diffusion in a deep trench capacitor DRAM). Using a bitline halo mask, the thin nitride layer 20 is opened at location 21, adjacent to the area where a borderless contact is desired.

This opening step is preferably accomplished using an anisotropic (nitride spacer) etch which is selective to oxide. Etch selectivities of 8:1 are readily achieved using known methods.

At this point, a bitline halo implant may be performed to provide an extra degree of drain-induced barrier lowering (DIBL) protection without increasing junction leakage on the node diffusion side of an array MOSFET. The bitline halo photoresist layer is then stripped. A polysilicon layer 22 is deposited and patterned to form landing pad regions for the metal studs which will provide contact to the higher-level metallurgy.

A second embodiment is described with reference to the sequence of schematic illustrations shown in FIGS. 10 to 15. This second embodiment provides a channel doping profile which differs from the profile of the MOSFET of the first embodiment. Furthermore, the MOSFET of the second embodiment has distinctly different electrical characteristics, which are important for meeting the needs of certain applications. Such special applications may include, for example, applications which require very low sensitivity of the threshold voltage ($V_t$) to variations in channel length, such as closely matched pairs of MOSFET's.

Figure 10:
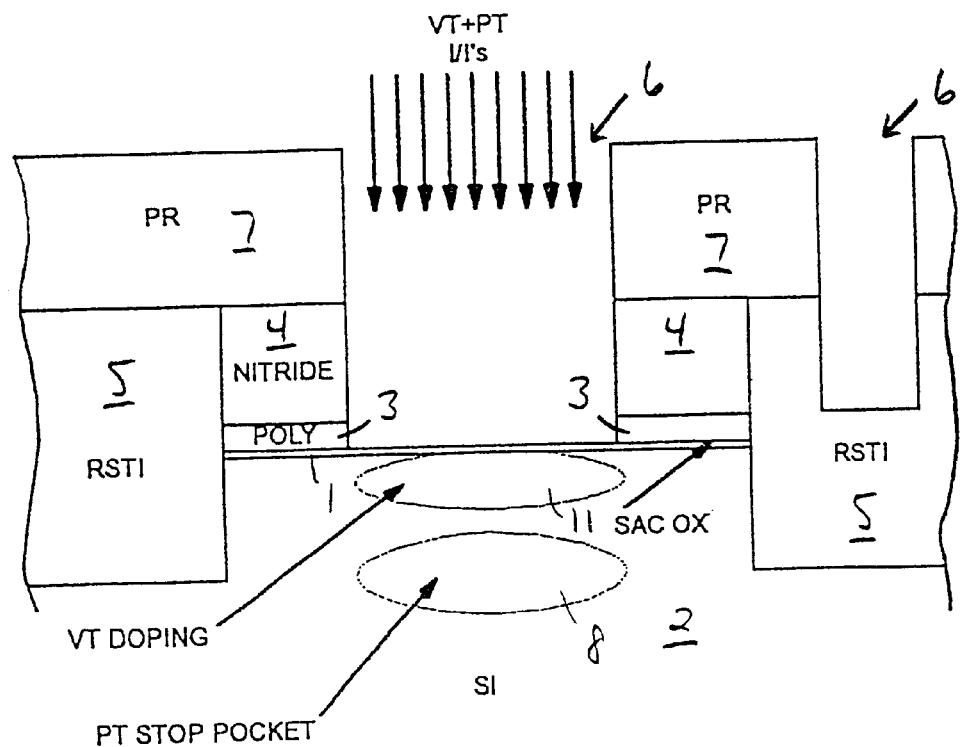
FIGS. 10 to 15 are sequential schematic illustrations showing a second embodiment of the improved process and structures of the present invention for manufacturing a MOSFET structure.

Referring to FIG. 10, the process of the second embodiment will be described from the point where it departs from the process of the first embodiment (i.e., following the process steps illustrated in FIGS. 1 and 2). In contrast with the first embodiment, both the tailoring of the threshold voltage ($V_t$) and the punch-through (PT) stop implantation have been done, see the arrows of FIG. 10, before formation of the spacers 9. In the first embodiment, the PT implant was done before spacer formation and the $V_t$ implant followed the formation of the BSG spacer.

Figure 11:
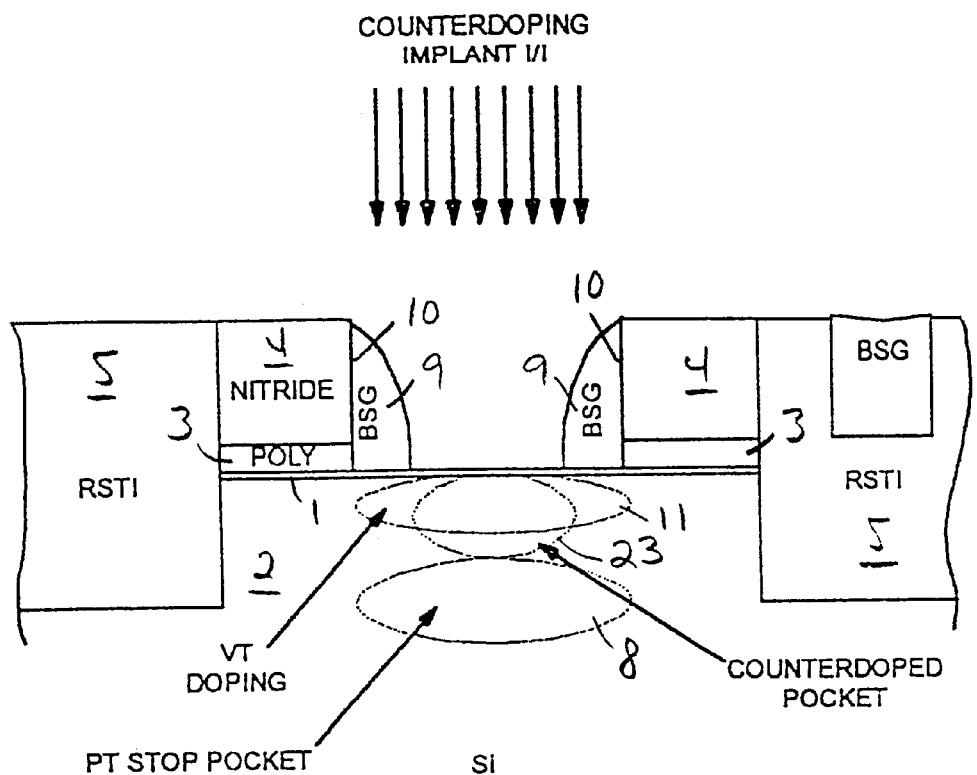

Referring to FIG. 11, and as described in the first embodiment, the spacers 9 are formed on the sidewalls 10 of the exposed stack of polysilicon layer 3 and nitride layer 4. At this point in the process, a counterdoping implant 23 is made. See the arrows of FIG. 11. The counterdoping implant 23 is offset from the sidewalls 10 and is performed with a dopant species having a polarity which is opposite to the dopant species used for the preceding $V_t$ and PT implants to form stop pocket 8 and doping implant 11.

For example, for an N-type MOSFET, the $V_t$ and PT implants would be performed with a P-type dopant such as boron or indium. The counterdoping implant 23 would then be performed with an N-type dopant such as arsenic or phosphorus. The $V_t$ doping implant 11 and the counterdoping implant 23 compensate each other to produce a doping concentration (in the embodiment illustrated, in the central region of the channel) which is less than the concentration produced by either the $V_t$ doping implant 11 or the counterdoping implant 23 alone. The net doping type in the counterdoped region may be either a P-type or an N-type, depending on the desired device characteristics.

Figure 12:
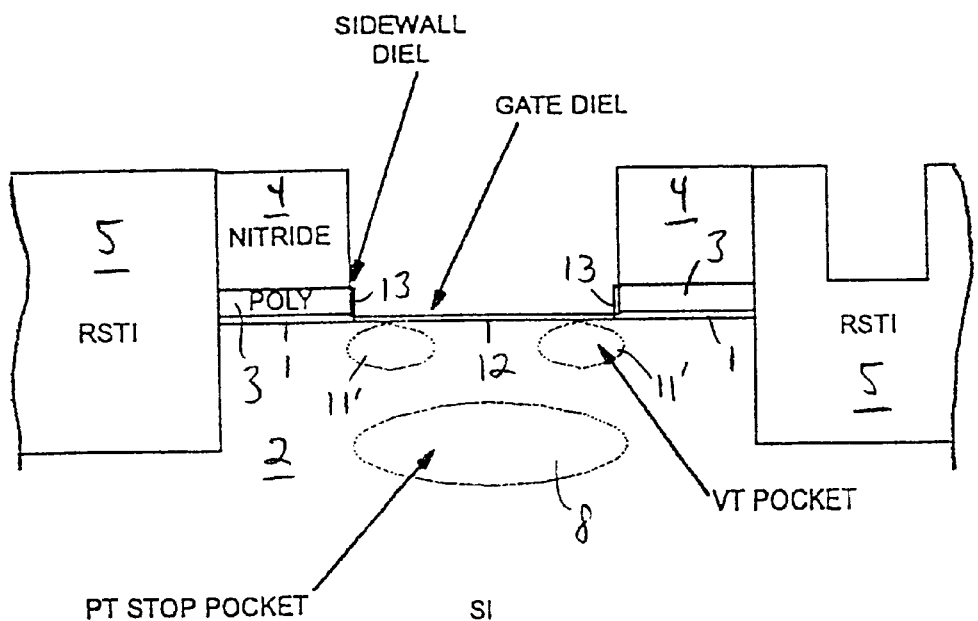

As in the first embodiment, and referring to FIG. 12, the spacers 9 and the exposed sacrificial oxide layer 1 are removed by known etching techniques. A gate dielectric layer 12 is formed. The compensation of the threshold voltage ($V_t$) and the counterdoping implants causes $V_t$ doping pockets 11' to be formed at the edges of the channel.

Figure 13:
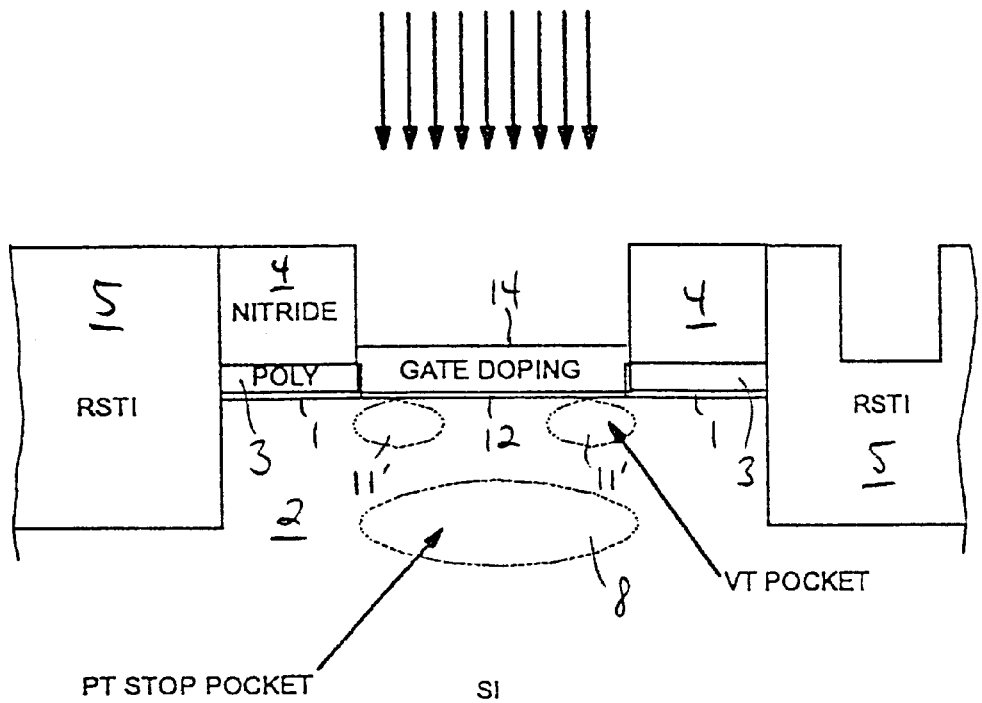
Figure 14:
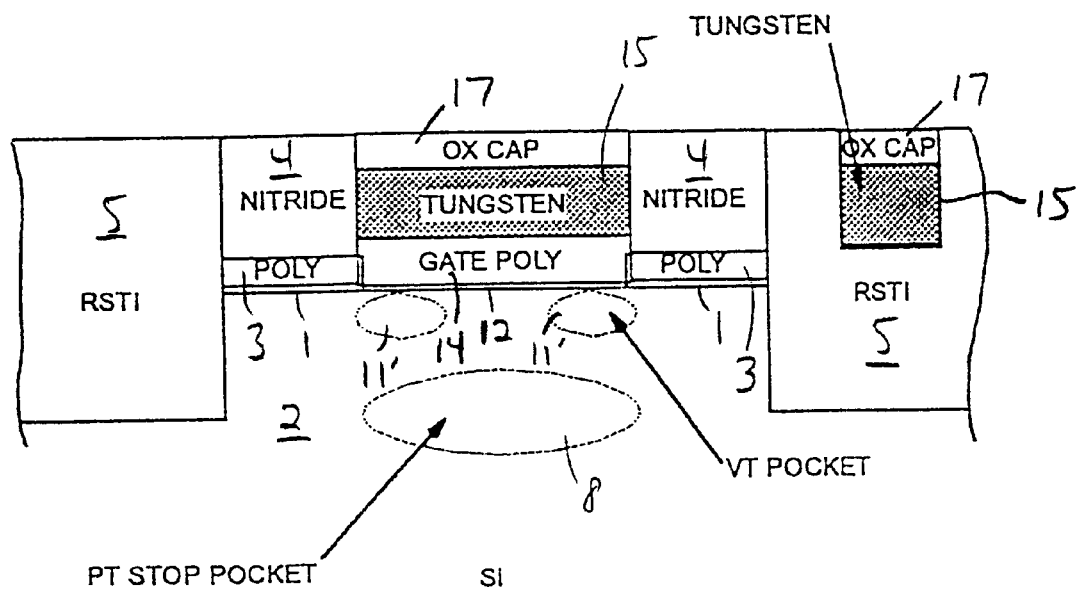
Figure 15:
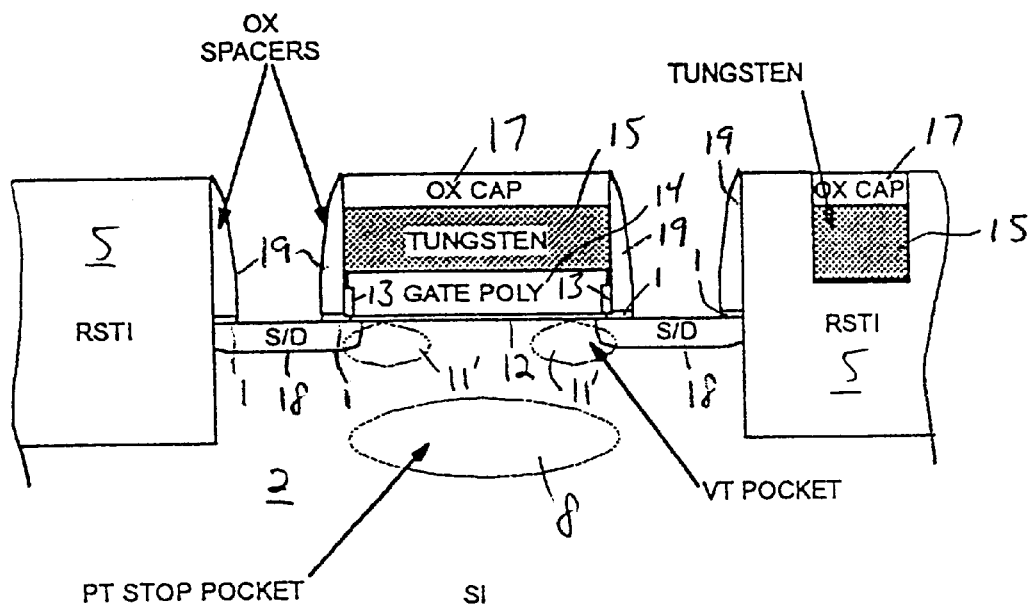

Referring to FIG. 13, the process then proceeds as described in the first embodiment with the formation of a polysilicon layer gate structure 14, and with the implantation of dual work-function dopants. Referring to FIG. 14, this process step is then followed by the formation of the high-conductivity tungsten layer 15 for the gate stack and the wiring channel, and the formation of the cap oxide layers 17. For completeness, and referring to FIG. 15, the device of the second embodiment is shown following the previously described formation of the S-D extension implants 18 and the oxide spacers 19. Subsequent steps are then performed, as previously described for the first embodiment, to complete the desired structure.

The principal difference between the device of the second embodiment and the device of the first embodiment deserves highlight. The former device has $V_t$ doping pockets 11' formed at the ends of the channel and light doping in the central region. In contrast, the latter device has a single $V_t$ doping implant 11 formed as one pocket centered at the mid-channel and light doping at the ends of the channel.

Figure 16:
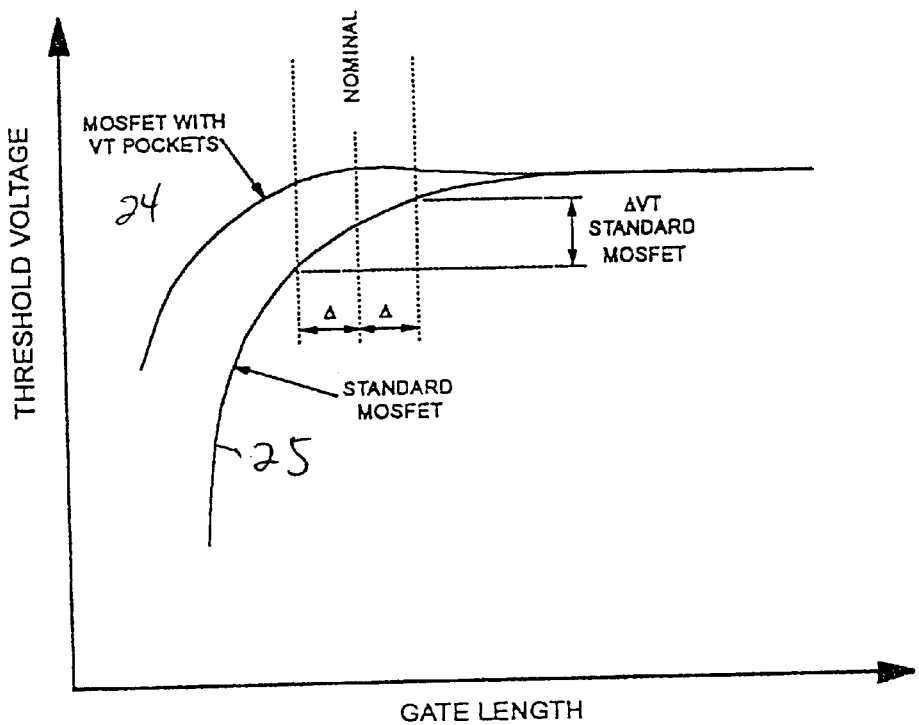
FIG. 16 is a graph which shows a qualitative comparison between the MOSFET resulting from the second embodiment of the present invention, as illustrated in FIGS. 10 to 15, and a conventional MOSFET.

Referring to FIG. 16, the $V_t$ roll-off characteristics 24 of the MOSFET of the second embodiment are qualitatively compared with the roll-off characteristics 25 of a standard MOSFET (i.e., a MOSFET having a conventional, uniform lateral doping distribution). Due to the presence of the (end) $V_t$ doping pockets 11', as the channel length of the MOSFET of the second embodiment is reduced, the threshold voltage ($V_t$) "bumps up" or remains fairly constant relative to the roll-off produced by the standard MOSFET. The degree of "bump-up" depends on the relative concentration of the $V_t$ doping pockets 11'.

As the channel is shortened, the doping pockets 11' extend over a larger percentage of the channel length. As a result, the $V_t$ doping concentration averaged over the length of the channel increases with decreasing channel length, compensating for the normal roll-off effect. By centering the nominal channel length selected for the MOSFET at the peak of the bump, the overall variation in $V_t$ with variations in channel length due to process variations may be reduced relative to what would result from the standard MOSFET.

Each of the two foregoing embodiments uses raised shallow trench isolation (RSTI) regions. It is also possible, although presently considered less preferred, to apply the foregoing improvements to structures using shallow trench isolation (STI) regions. One such embodiment will be described with reference to FIGS. 17 to 21. This STI embodiment corresponds to the first embodiment in terms of its use of a single $V_t$ doping implant 11 centered at mid-channel length with its edges offset from the adjacent S-D diffusions. It would also be possible to use STI in an embodiment which corresponds to the second embodiment (by combining the second and third embodiments), if desired.

Figure 17:
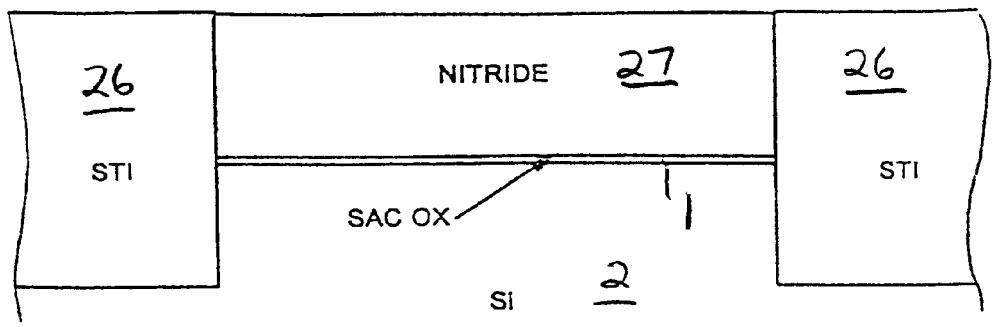
FIGS. 17 to 21 are sequential schematic illustrations showing a third embodiment of the improved process and structures of the present invention for manufacturing a MOSFET structure with STI.

Turning to FIG. 17, the pad structure is preferably comprised of a sacrificial oxide layer 1 and a nitride layer 27 for use with STI regions 26. Distinguish this structure from the oxide/polysilicon/nitride system used with RSTI. The oxide/nitride pad structure used with the STI embodiment may be part of the pad structure originally formed on the substrate before conventional deep trench (DT) storage capacitor definition. As a result, for the STI process, the original pad structure need not be removed and a new pad structure need not be defined. This process is to be distinguished from the first two embodiments, using RSTI, where the oxide/polysilicon/nitride pad structure is preferably a new pad structure (because the oxide/polysilicon/nitride system is less compatible with a DT process).

Figure 18:
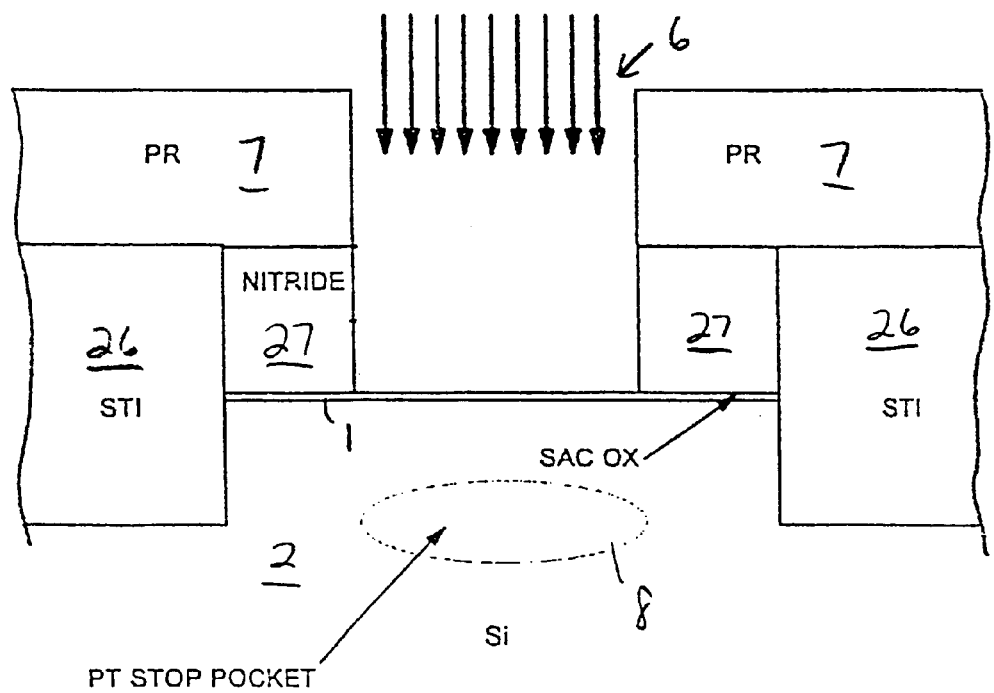

Referring to FIG. 18, the STI process subjects the nitride layer 27 to a directional anisotropic etching process, such as an RIE process, through openings suitably patterned in a photoresist (PR) layer 7. As a result, apertures or openings 6 are concurrently formed in the (pad) nitride layer 27.

Punch-through ion implantation (PT I/I) is illustrated by the arrows of FIG. 18. A relatively deep sub-surface, punch-through suppression implant 8 (a "stop pocket") is then formed to prevent punch through between the source and the drain of the MOSFET which is later to be formed.

Figure 19:
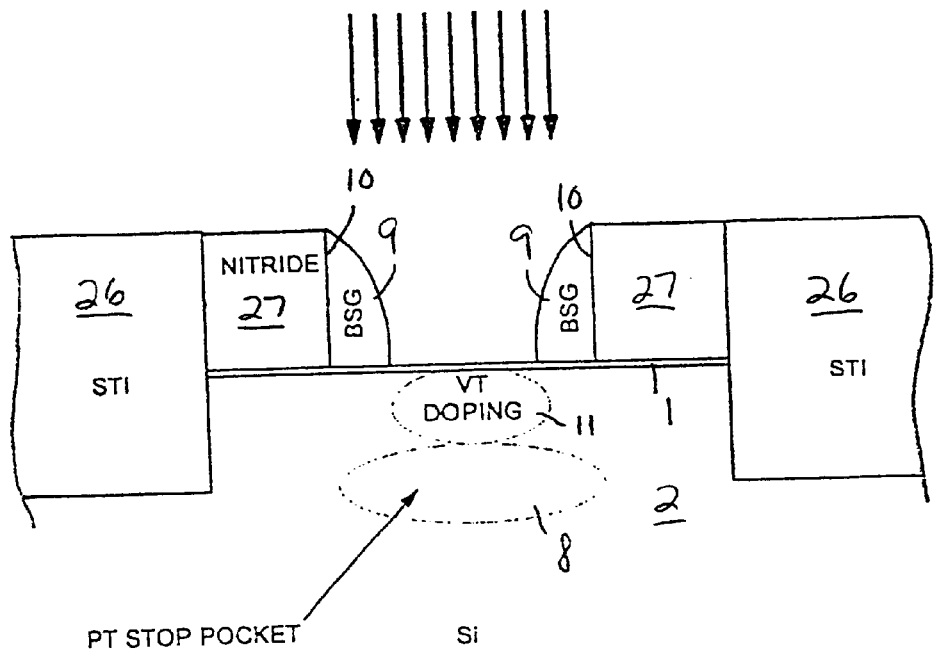

Referring to FIG. 19, the photoresist layer 7 is then stripped and spacers 9 are formed on the sidewalls 10 of the opening 6. The spacers 9 are preferably formed of a material that contains a P-type dopant, for example, a glass such as BSG (borosilicate glass). The channel is then ion implanted (I/I) at low energy to set the threshold voltage ($V_t$) of the MOSFET, see the arrows of FIG. 19, defining the channel doping profile or $V_t$ implant 11. The edges of the $V_t$ implant 11 are offset from the sidewalls 10 of the polysilicon/nitride stack.

Figure 20:
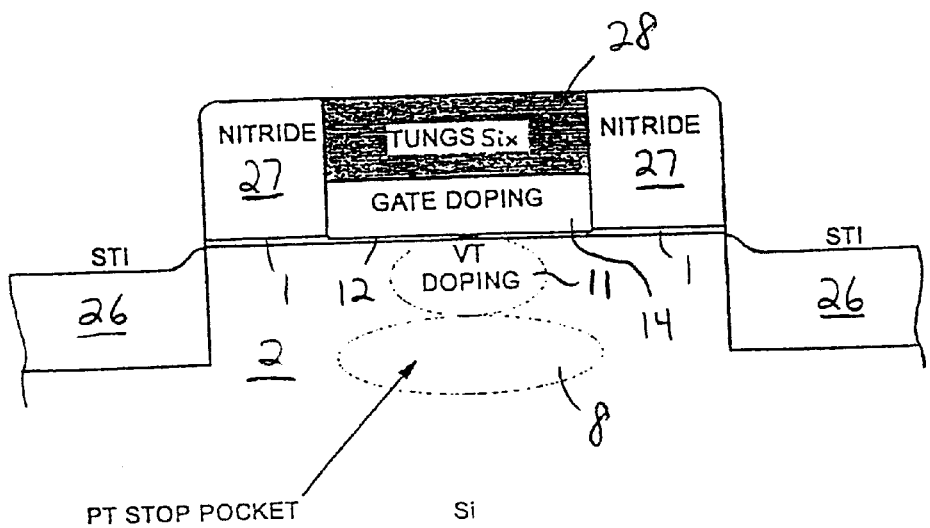

Referring to FIG. 20, the BSG spacers 9 are then stripped selective to nitride layers 27. The exposed sacrificial oxide layer 1 is thereafter stripped and a gate dielectric layer 12 is formed in its place. The gate dielectric layer 12 may be comprised of a thermally grown $SiO_2$, a nitride gate oxide, or a deposited dielectric film. A layer of polysilicon (or an equivalent material) is deposited to a thickness which completely fills the opening 6, to form a gate structure 14. The polysilicon layer is first planarized to the top surface of the pad nitride layers 27 and is then recessed, as shown. The exposed polysilicon of the gate structure 14 is then ion implanted to set the work-function of the gate conductor (GC).

In practice, elemental tungsten (tantalum or molybdenum) cannot be used as the top-level gate conductor with STI processes because the gate sidewall oxidation would consume the tungsten. Still referring to FIG. 20, therefore, tungsten silicide 28 (or the silicides of tantalum or molybdenum) must for this reason be used in the STI embodiment. With the RSTI embodiments, elemental tungsten may be used because it is not exposed to any oxidation following deposition. Consequently, the RSTI embodiments have the advantage of providing significantly lower gate conductor sheet resistance.

In addition, with the STI embodiment, because the height of the aperture 6 is lower than with raised STI (due to the absence of a poly layer), there is an increased probability that the top of the STI regions 26 will be recessed below the top surface of the silicon wafer 2. Such geometry, which results from the STI process, tends to degrade the ability to control the threshold voltage ($V_t$). It is considered desirable to have the top of the isolation elevated above the top of the silicon surface, which is ensured with the RSTI embodiments.

Figure 21:
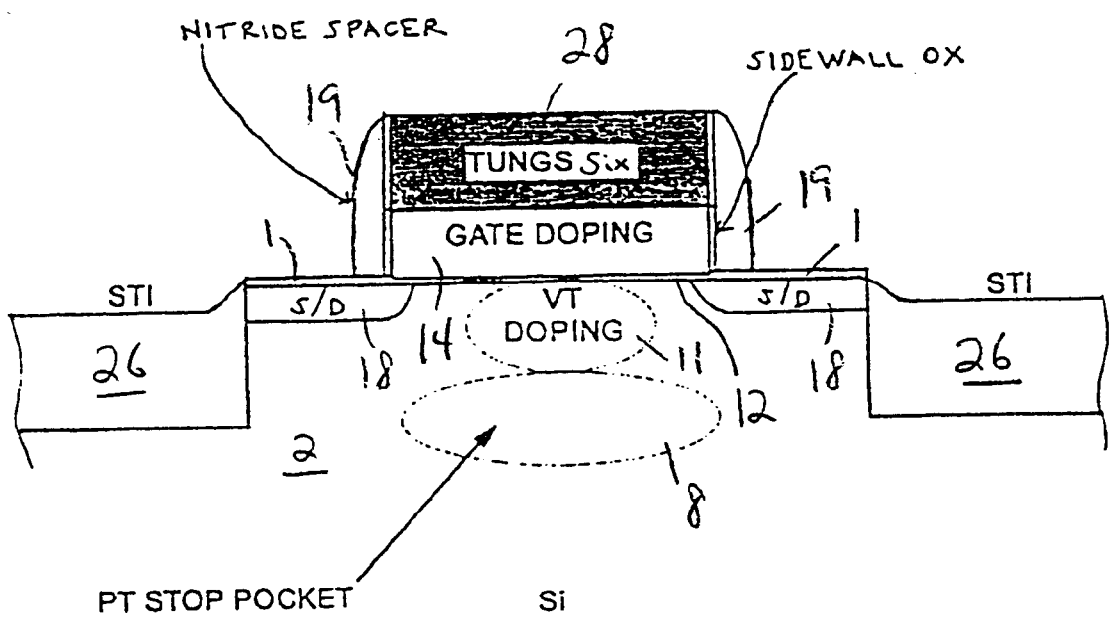

Referring to FIG. 21, the pad nitride layer 27 is removed by etching with hot phosphoric acid or an equivalent wet or dry etch which etches silicon nitride with a high selectivity to Si or $SiO_2$. S-D extension implants 18 may be made at this point in the process, and supplemental halo implants may be added, if desired. Oxide spacers 19 are then formed on the sidewalls of the S-D contact openings and higher-concentration contact implants are made.

For use with STI, gate sidewall oxidation must be done after gate deposition, planarization, and doping, because the polysilicon layer in the pad is not present. This requirement adds to the thermal budget seen by the gate dopant and makes the control of boron penetration through the gate insulator more difficult. For this reason, the use of RSTI has the advantage of removing gate sidewall oxidation from the thermal budget influencing boron penetration, and is more compatible with a dual work-function complementary metal-oxide semiconductor (CMOS) technology.

It will therefore be understood that various changes in the details, materials and arrangement of parts which have been herein described and illustrated in order to explain the nature of this invention may be made by those skilled in the art within the principle and scope of the invention as expressed in the following claims.

What is claimed:

1. A MOSFET structure comprising:

a layered gate structure including a base wafer, a gate dielectric layer covering the base wafer, a doped gate structure covering the gate dielectric layer and being implanted to set a work-function for the gate structure, a refractory metal deposit covering the doped gate structure, and an oxide cap covering the refractory metal deposit;

raised shallow trench isolation regions extending to a level above the top surface of the refractory metal deposit and spaced from and located on opposing sides of the layered gate structure, defining source/drain contact openings between the layered gate structure and the raised shallow trench isolation regions;

source/drain extension implants electrically connecting and extending between the layered gate structure and the raised shallow trench isolation regions;

an implanted punch-through stop pocket formed in the base wafer and positioned beneath the layered gate structure; and an implant setting a threshold voltage for the MOSFET structure, formed in the base wafer and positioned beneath the layered gate structure, and located between the implanted punch-through stop pocket and the layered gate structure, wherein one of the raised shallow trench isolation regions includes a wiring channel, wherein the wiring channel receives a refractory metal deposit, and wherein the refractory metal deposit received in the wiring channel corresponds to the refractory metal deposit covering the doped gate structure.

2. The structure of claim 1 which further includes an oxide cap covering the refractory metal deposit received in the wiring channel.

3. The structure of claim 1 wherein the base wafer is formed of silicon.

4. The structure of claim 1 wherein the implant setting the threshold voltage is offset from the sidewalls of the layered gate structure.

5. The structure of claim 4 wherein the offset produces a doping concentration adjacent to the sidewalls which is lower than a doping concentration produced toward center portions of the layered gate structure.

6. The structure of claim 1 having a plurality of doping pockets for determining the threshold voltage, wherein the doping pockets are positioned adjacent to and offset from the sidewalls of the layered gate structure.

7. The structure of claim 6 wherein the doping pockets are positioned to produce a doping concentration adjacent to the sidewalls which is higher than a doping concentration produced toward center portions of the layered gate structure.

8. The structure of claim 1 wherein the gate dielectric layer is formed of a material selected from the group of dielectric materials including a thermally grown $SiO_2$, a nitride gate oxide, and a deposited dielectric film.

9. The structure of claim 1 wherein the doped gate structure incorporates dual work-function gate doping.

10. The structure of claim 1 wherein the refractory metal deposit is selected from the group of refractory materials including tungsten, tantalum, molybdenum, and the suicides of tungsten, tantalum, and molybdenum.

11. The structure of claim 1 wherein the gate structure is implanted with a doping ion, the source/drain extension implants are implanted with a doping ion which is of a different type from the doping ion implanted in the gate structure, wherein the gate structure is substantially free of the doping ions implanted in the source/drain extensions.

12. The structure of claim 1 further comprising a borderless contact formed over the MOSFET structure wherein the borderless contact is bounded on one side by the gate structure and on the opposite side by the shallow raised shallow trench isolation structure.

13. The structure of claim 12 wherein the borderless contact includes a thin nitride layer deposited over the MOSFET structure so that the nitride layer conforms to underlying features of the MOSFET structure, an opening formed in the thin nitride layer in an area for receiving the borderless contact, and a polysilicon layer deposited over the opened area and patterned to form a landing pad region for receiving a contact for the MOSFET.

14. The structure of claim 1 wherein the MOSFET structure defines a gated array MOSFET.

15. The structure of claim 1 wherein the layered gate structure has sidewalls with a vertical length, and wherein the sidewalls are essentially vertical fully along the length of the sidewalls.

* * * * *